US012334438B2

(12) United States Patent
Kang et al.

(10) Patent No.: US 12,334,438 B2
(45) Date of Patent: Jun. 17, 2025

(54) SEMICONDUCTOR DEVICE

(71) Applicant: SAMSUNG ELECTRONICS CO., LTD., Suwon-si (KR)

(72) Inventors: Minsung Kang, Yongin-si (KR); Hyoungyol Mun, Yongin-si (KR); Sungdong Cho, Hwaseong-si (KR); Wonhee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 490 days.

(21) Appl. No.: 17/742,619

(22) Filed: May 12, 2022

(65) Prior Publication Data
US 2023/0019790 A1 Jan. 19, 2023

(30) Foreign Application Priority Data

Jul. 19, 2021 (KR) .......... 10-2021-0094202

(51) Int. Cl.
*H01L 21/768* (2006.01)
*H01L 23/528* (2006.01)
*H01L 23/532* (2006.01)

(52) U.S. Cl.
CPC ........ *H01L 23/528* (2013.01); *H01L 21/7682* (2013.01); *H01L 23/5329* (2013.01)

(58) Field of Classification Search
CPC ........... H01L 21/7682; H01L 21/76835; H01L 23/528; H01L 27/0207; H01L 2221/1042–1047
See application file for complete search history.

(56) References Cited

U.S. PATENT DOCUMENTS

| 5,747,880 | A | 5/1998 | Havemann et al. |
| 6,143,629 | A | 11/2000 | Sato |
| 6,399,476 | B2 * | 6/2002 | Kim .................... H01L 21/7682 438/668 |
| 6,867,431 | B2 | 3/2005 | Konuma et al. |
| 8,274,155 | B2 | 9/2012 | Usami |
| 8,592,283 | B2 | 11/2013 | Ito et al. |
| 9,401,304 | B2 | 7/2016 | Fukuo |
| 9,852,980 | B2 | 12/2017 | Bonilla et al. |

(Continued)

FOREIGN PATENT DOCUMENTS

| KR | 10-2011-0039296 A | 4/2011 |
| KR | 10-2014-0000771 A | 1/2014 |
| KR | 10-2020-0078029 A | 7/2020 |

*Primary Examiner* — Walter H Swanson
*Assistant Examiner* — Jacob T Nelson
(74) *Attorney, Agent, or Firm* — Muir Patent Law, PLLC

(57) ABSTRACT

A semiconductor device includes a semiconductor substrate including a first region and a second region, first metal lines spaced apart from each other at a first interval on the first region, second metal lines spaced apart from each other at a second interval on the second region, the second interval being less than the first interval, and a passivation layer on the semiconductor substrate and covering the first and second metal lines, the passivation layer including sidewall parts covering sidewalls of the first metal lines and the second metal lines, the sidewall parts including a porous dielectric layer, upper parts covering top surfaces of the first metal lines and the second metal lines, and an air gap defined by the sidewall parts between the second metal lines.

19 Claims, 13 Drawing Sheets

(56) References Cited

U.S. PATENT DOCUMENTS

| | | |
|---|---|---|
| 2003/0211752 A1 | 11/2003 | Rattner et al. |
| 2009/0325381 A1 | 12/2009 | Chan et al. |
| 2015/0037980 A1* | 2/2015 | Rha .................. H01L 21/76832 |
| | | 438/700 |
| 2015/0118862 A1 | 4/2015 | Reilly et al. |
| 2015/0187699 A1* | 7/2015 | Baek .................. H01L 23/5222 |
| | | 257/773 |
| 2020/0203239 A1 | 6/2020 | Park |

* cited by examiner

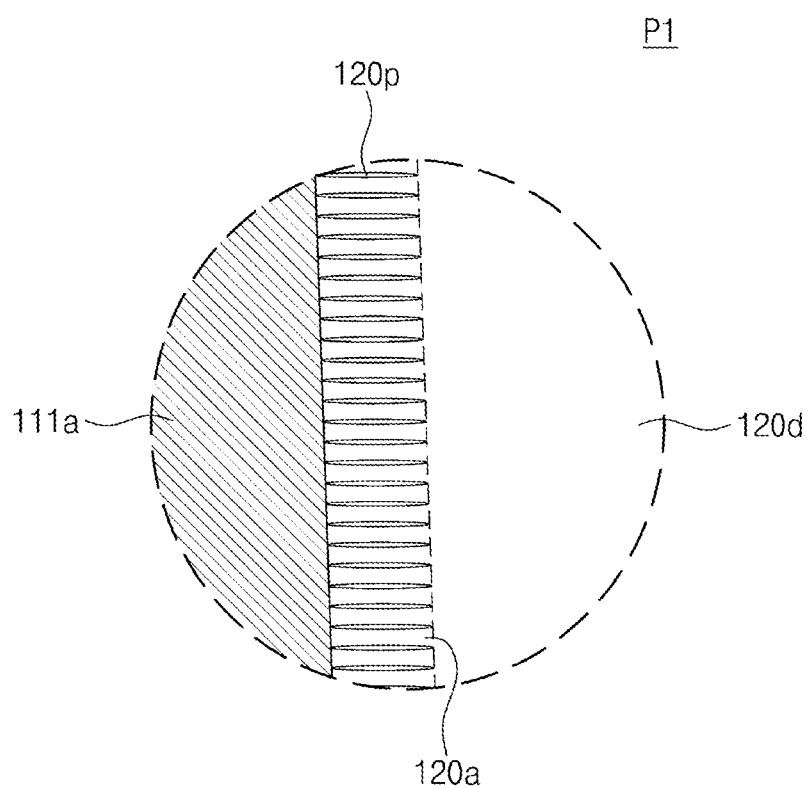

SEMICONDUCTOR DEVICE

CROSS-REFERENCE TO RELATED APPLICATION

This U.S. nonprovisional application claims priority under 35 U.S.C § 119 to Korean Patent Application No. 10-2021-0094202, filed on Jul. 19, 2021, in the Korean Intellectual Property Office, the disclosure of which is hereby incorporated by reference in its entirety.

BACKGROUND

1. Field

Embodiments relate to a semiconductor device, and more particularly, to a semiconductor device including metal lines.

2. Description of the Related Art

As integrated circuits are developed, there is a demand for a semiconductor device capable of high-speed operation and high integration. For example, such a semiconductor device may include a line-width that falls within a range of several tens of nanometers.

SUMMARY

According to some embodiments, a semiconductor device may include a semiconductor substrate including a first region and a second region; a plurality of first metal lines that are spaced apart from each other at a first interval on the first region; a plurality of second metal lines that are spaced apart from each other at a second interval on the second region, the second interval being less than the first interval; and a passivation layer on the semiconductor substrate and covering the first and second metal lines, the passivation layer including a plurality of sidewall parts that cover sidewalls of the first and second metal lines and a plurality of upper parts that cover top surfaces of the first and second metal lines. The sidewall parts of the passivation layer may include a porous dielectric layer. The passivation layer may have an air gap defined by the sidewall parts between the second metal lines.

According to some embodiments, a semiconductor device may include a plurality of metal lines on a semiconductor substrate; and a passivation layer that covers the metal lines, the passivation layer including a plurality of sidewall parts that cover sidewalls of the metal lines and a plurality of upper parts that cover top surfaces of the metal lines. The passivation layer may have a plurality of pores. A density of the pores at the upper parts may be greater than a density of the pores at the upper parts.

According to some embodiments, a semiconductor device may include a first metal line that has a first width on a lower layer; a second metal line that has a second width less than the first width on the lower layer; a third metal line that has the second width between the first metal line and the second metal line; and a passivation layer that covers the first, second, and third metal lines. The passivation layer may include: a porous region adjacent to sidewalls of the first, second, and third metal lines; and a non-porous region adjacent to top surfaces of the first, second, and third metal lines.

BRIEF DESCRIPTION OF THE DRAWINGS

Features will become apparent to those of skill in the art by describing in detail exemplary embodiments with reference to the attached drawings, in which:

FIGS. 6A, 6B, and 6C illustrate enlarged views of section P1 of FIG. 5.

DETAILED DESCRIPTION

Figure 1:
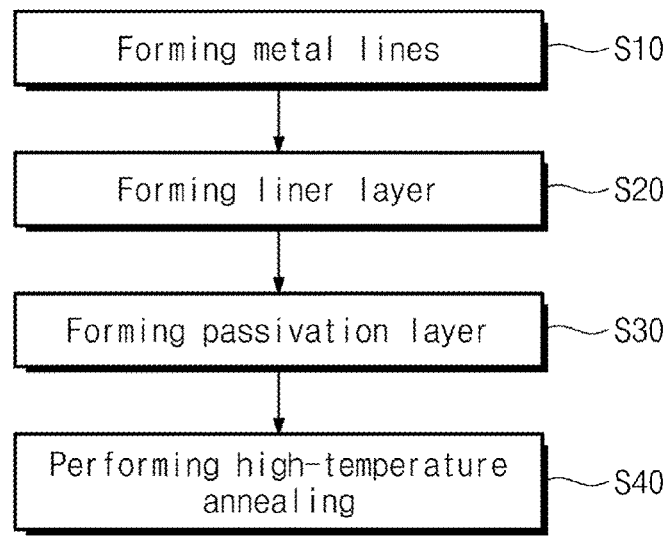
FIG. 1 illustrates a flow chart of a method of fabricating a semiconductor device according to some embodiments.
Figure 2:
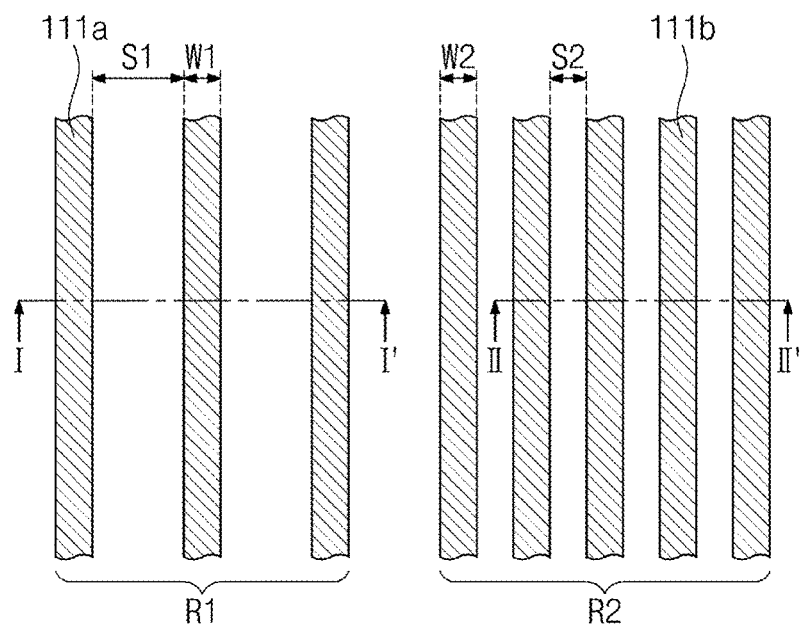
FIG. 2 illustrates a partial plan view of a semiconductor device according to some embodiments.
Figure 3:
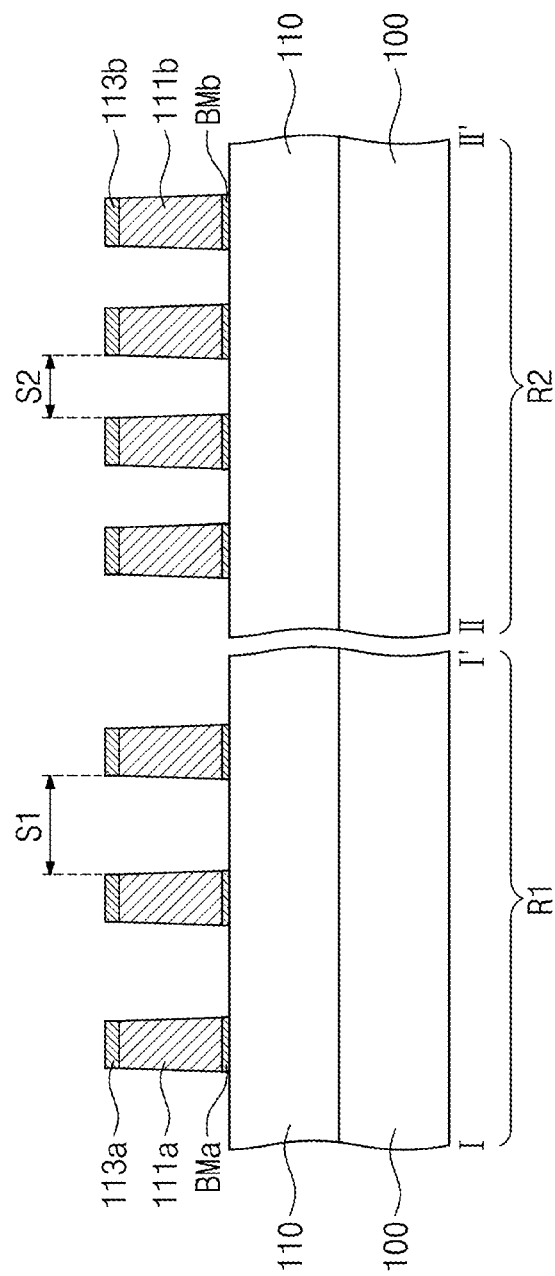
FIGS. 3 to 5 illustrate cross-sectional views along lines I-I' and II-II' of FIG. 2, showing stages in a method of fabricating a semiconductor device according to some embodiments.
Figure 4:
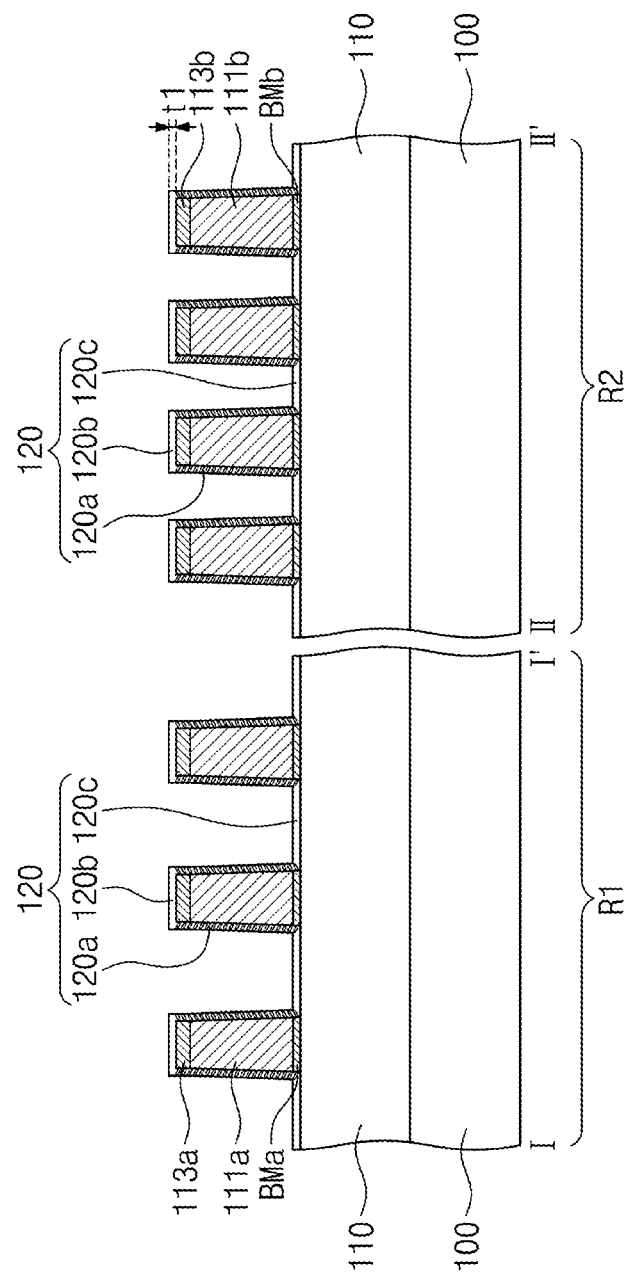
Figure 5:
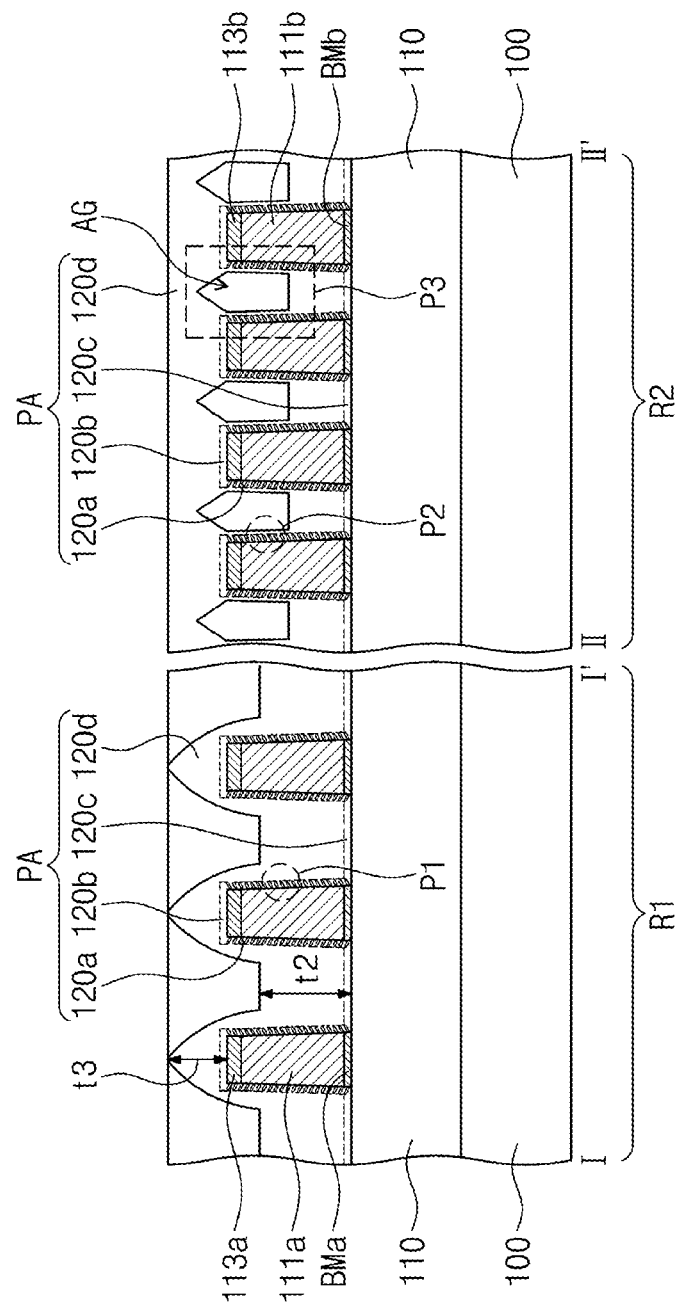
Figure 6A:
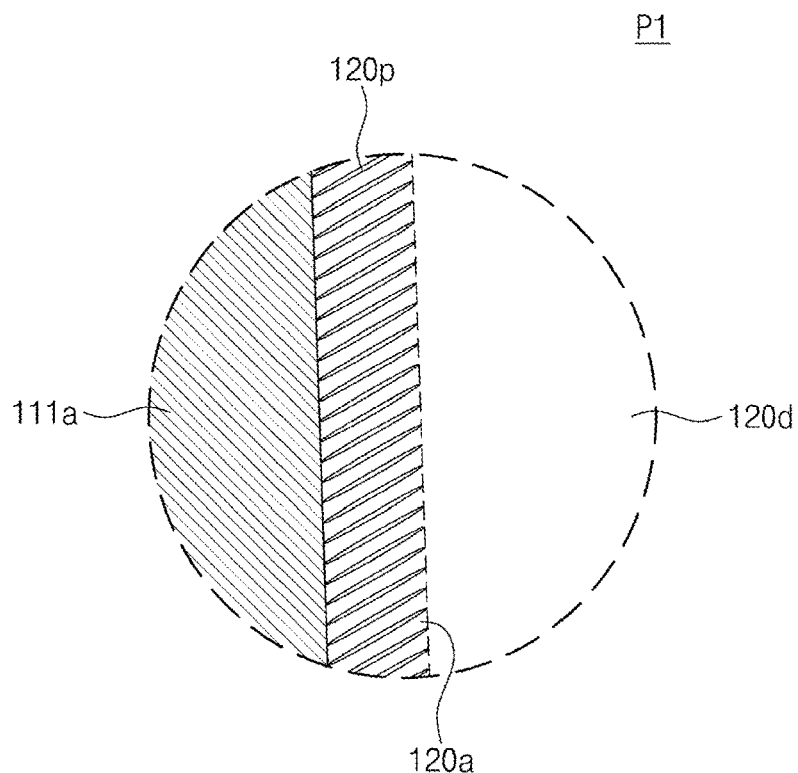
Figure 6B:
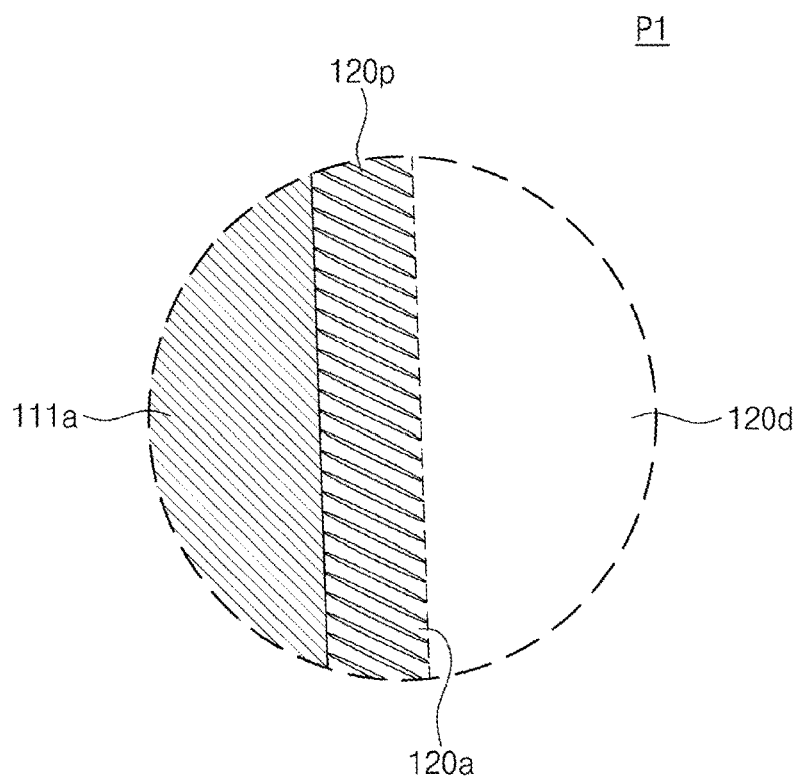
Figure 7:
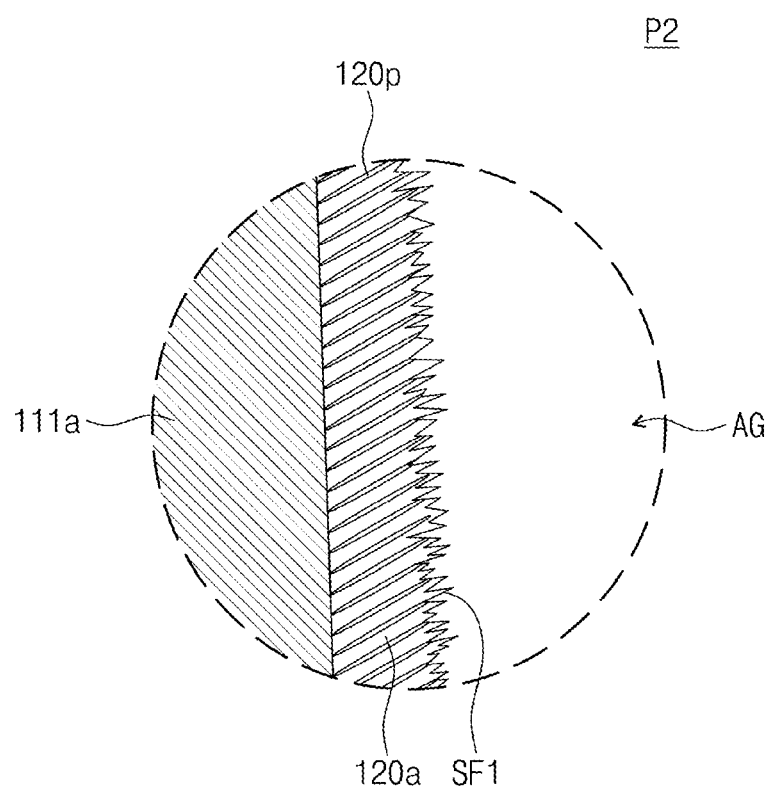
FIG. 7 illustrates an enlarged view of section P2 of FIG. 5.
Figure 8:
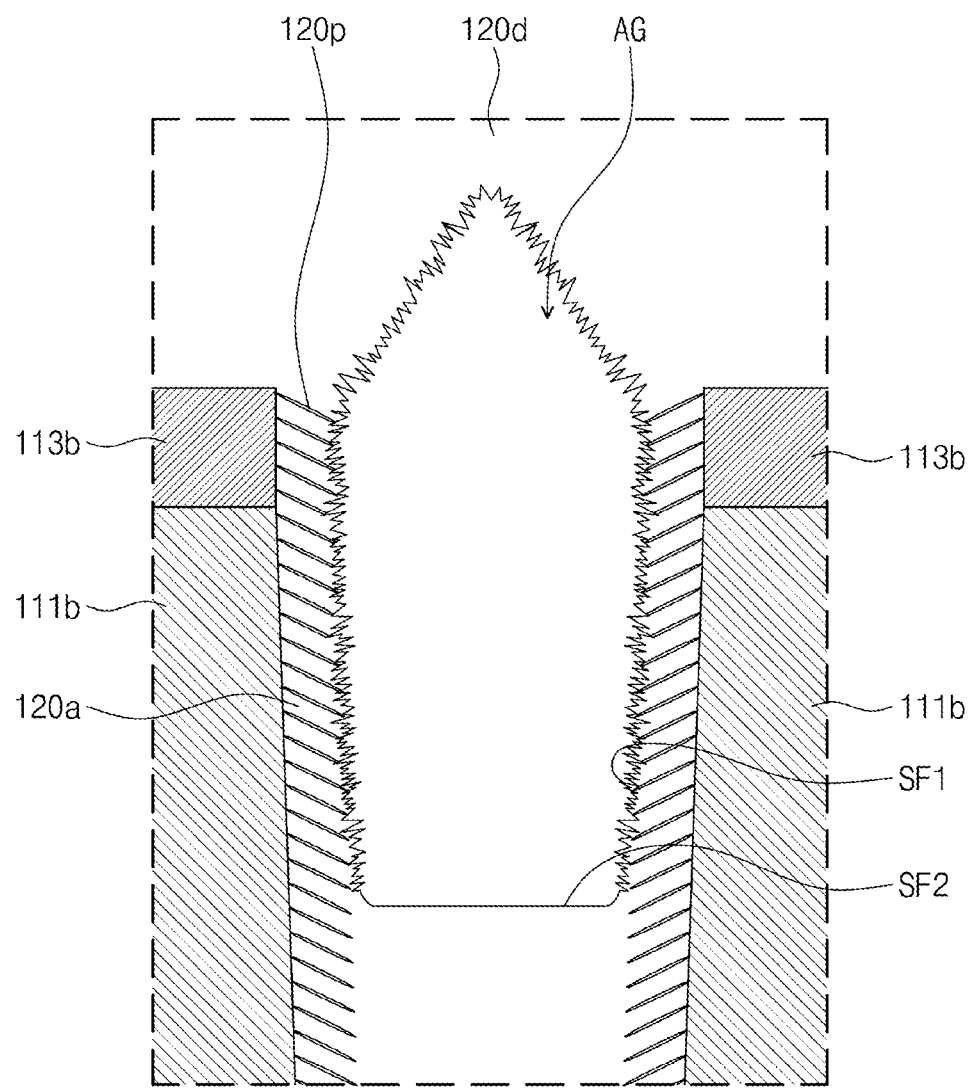
FIG. 8 illustrates an enlarged view of section P3 of FIG. 5.

FIG. 1 illustrates a flow chart of a method of fabricating a semiconductor device according to some embodiments. FIG. 2 illustrates a partial plan view of a semiconductor device according to some embodiments. FIGS. 3 to 5 illustrate cross-sectional views along lines I-I' and II-II' of FIG. 2, showing stage in a method of fabricating a semiconductor device according to some embodiments. FIGS. 6A, 6B, and 6C illustrate enlarged views of section P1 of FIG. 5. FIG. 7 illustrates an enlarged view of section P2 of FIG. 5. FIG. 8 illustrates an enlarged view of section P3 of FIG. 5.

Referring to FIGS. 1, 2, and 3, metal lines 111a and 111b may be formed on a semiconductor substrate 100 that includes first and second regions R1 and R2 (S10). A lower layer 110 may be formed between the semiconductor substrate 100 and the metal lines 111a and 111b.

For example, the semiconductor substrate 100 may include the first region R1 and the second region R2. The semiconductor substrate 100 may be one or more of, e.g., a silicon substrate, a germanium substrate, and a silicon-germanium substrate.

The lower layer 110 may be formed on the semiconductor substrate 100, e.g., on an upper surface of the semiconductor substrate 100. The lower layer 110 may include conductive patterns and dielectric layers. The lower layer 110 may cover semiconductor elements formed on the semiconductor substrate 100. For example, the semiconductor elements may include metal oxide semiconductor (MOS) transistors, a capacitor, a resistor, contact plugs, and connection lines.

For example, the lower layer 110 may include high density plasma (HDP) oxide, tetraethylorthosilicate (TEOS), plasma enhanced tetraethylorthosilicate (PE-TEOS), $O_3$-tetraethylorthosilicate ($O_3$-TEOS), undoped silicate glass (USG), phosphosilicate glass (PSG), borosilicate glass (BSG), borophosphosilicate glass (BPSG), fluorosilicate glass (FSG), spin on glass (SOG), Tonen Silazene (TOSZ), or a combination thereof. In another example, the lower layer 110 may include a dielectric material whose dielectric constant is less than that of silicon oxide, and may be formed of at least one layer. The lower layer 110 may include, e.g., fluorine-doped oxide (or FSG), carbon-doped oxide, silicon oxide, hydrogen silsesquioxane (HSG, SiO:H), methyl silsesquioxane (MSQ, SiO:CH$_3$), or a-SiOC (SiOC:H).

The formation of the metal lines 111a and 111b on the lower layer 110 may include sequentially forming a barrier metal layer, a metal layer, and a metal capping layer on the lower layer 110, forming a mask pattern on the metal capping layer (e.g., via photolithography), and using the mask pattern as an etching mask to sequentially etch the metal capping layer, the metal layer, and the barrier metal layer to form metal capping patterns, the metal lines 111a and 111b, and barrier metal patterns, respectively.

The metal lines 111a and 111b may include first metal lines 111a provided on the first region R1 and second metal lines 111b provided on the second region R2.

In some embodiments, the first and second metal lines 111a and 111b may be electrically connected through contact plugs and lower lines to semiconductor elements on the semiconductor substrate 100. In some embodiments, the first and second metal lines 111a and 111b may include, e.g., independently, at least one of tungsten (W), aluminum (Al), titanium (Ti), tantalum (Ta), cobalt (Co), and ruthenium (Ru).

The first metal lines 111a may extend in parallel along one direction. The first metal lines 111a may each have a first width W1 and may be disposed at a first interval S1.

The second metal lines 111b may each have a second width W2 and may be disposed at a second interval S2. In some embodiments, the second width W2 may be substantially the same as the first width W1, and the second interval S2 may be less than the first interval S1.

The barrier metal patterns may include first and second barrier metal patterns BMa and BMb. The first barrier metal pattern BMa may be disposed between the lower layer 110 and each of the first metal lines 111a, and the second barrier metal pattern BMb may be disposed between the lower layer 110 and each of the second metal lines 111b. The first and second barrier metal patterns BMa and BMb may be formed, e.g., independently, of Ti, Ta, TiN, WN, TaN, TiSiN, TaSiN, TiAlN, or any combination thereof.

The metal capping patterns may include first and second metal capping patterns 113a and 113b. The first metal capping pattern 113a may be disposed on each of the first metal lines 111a, and the second metal capping pattern 113b may be disposed on each of the second metal lines 111b. The first and second metal capping patterns 113a and 113b may suppress scattered reflection on top surfaces of the first and second metal lines 111a and 111b in photolithography and etching processes in which the first and second metal lines 111a and 111b are patterned. The first and second metal capping patterns 113a and 113b may be, e.g., independently, formed of Ti, Ta, TiN, WN, TaN, TiSiN, TaSiN, TiAlN, or any combination thereof.

Referring to FIGS. 1, 2, and 4, a liner layer 120 may be formed on the semiconductor substrate 100 on which the metal lines 111a and 111b are formed (S20). For example, as illustrated in FIG. 4, the liner layer 120 may cover surfaces of the metal lines 111a and 111b, as well as portions of the lower layer 110 therebetween.

The liner layer 120 may be formed by using a layer formation technique with excellent conformality or step coverage. For example, the liner layer 120 may be formed by using plasma enhanced chemical vapor deposition (PECVD), high density plasma (HDP), or sputtering. The liner layer 120 may be, e.g., a high density plasma (HDP) oxide layer.

The liner layer 120 may have an irregular, e.g., non-constant, thickness on the top surfaces and sidewalls of the first and second metal lines 111a and 111b. For example, the liner layer 120 may be thinner on the sidewalls of the first and second metal lines 111a and 111b than on the top surfaces of the first and second metal lines 111a and 111b. According to some embodiments, when the liner layer 120 is deposited, the liner layer 120 may be formed as a non-porous layer on the top surfaces of the first and second metal lines 111a and 111b, and may be formed selectively as a porous layer on the sidewalls of the first and second metal lines 111a and 111b.

When the liner layer 120 is deposited, a deposition rate on the top surfaces of the first and second metal lines 111a and 111b may be different from that of the sidewalls of the first and second metal lines 111a and 111b, e.g., due to the vertical orientation of the sidewalls and intervals therebetween relative to the flat and upward facing top surfaces and/or due to the different materials of the metal lines 111a and 111b relative to the metal capping patterns 113a and 113b. When the liner layer 120 is deposited, the liner layer 120 may have pores, which pores may be formed directionally in one direction on the sidewalls of the first and second metal lines 111a and 111b, e.g., due to the lower deposition rate and coverage of the sidewalls and/or due to the different materials of the metal lines 111a and 111b relative to the metal capping patterns 113a and 113b. A density of the pores, e.g., porosity, on the top surfaces of the first and second metal lines 111a and 111b may be less than that of the pores on the sidewalls of the first and second metal lines 111a and 111b, e.g., due to higher deposition rate and better coverage on the top surfaces. The formation of the liner layer 120 will be further discussed in detail below with reference to FIGS. 9 and 10.

The liner layer 120 may include sidewall parts 120a that cover the sidewalls of the first and second metal lines 111a and 111b, upper parts 120b that cover the top surfaces of the first and second metal lines 111a and 111b, and a lower part 120c that covers a top surface of the lower layer 110 between, e.g., adjacent ones of, the first metal lines 111a and the second metal lines 111b. In some embodiments, when the liner layer 120 has a thickness of about 300 Å at the upper parts 120b, the liner layer 120 may have a thickness of equal to or greater than about 50 Å at the sidewall parts 120a. For example, based on a deposition thickness of the liner layer 120, the thickness at, e.g., each of, the sidewall parts 120a may range from about 50 Å to about 2,000 Å.

The liner layer 120 may have pores at the sidewall parts 120a. A dielectric constant of the sidewall parts 120a of the liner layer 120 may be less than that of the upper parts 120b of the liner layer 120.

Referring to FIGS. 1, 2, and 5, a passivation layer PA may be formed on the liner layer 120 (S30). For example, the passivation layer PA may be formed of the same material as the liner layer 120, so there may not be a boundary between the passivation layer PA and the liner layer 120.

In detail, the passivation layer PA may be deposited in-situ with the liner layer 120 and may be formed of the same dielectric material as that of the liner layer 120. Therefore, no boundary may be present between the passivation layer PA and the liner layer 120. The passivation layer PA may be formed by using, e.g., plasma enhanced chemical vapor deposition (PECVD), high density plasma (HDP), or sputtering.

The passivation layer PA may fill a space between, e.g., adjacent ones of, the first metal lines 111a on the first region R1, and may have an air gap AG between, e.g., adjacent ones of, the second metal lines 111b on the second region R2. The formation of the passivation layer PA will be further discussed in detail below with reference to FIGS. 9 and 10.

The passivation layer PA may include sidewall parts 120a that cover the sidewalls of the first and second metal lines 111a and 111b, upper parts 120b that cover the top surfaces of the first and second metal lines 111a and 111b, lower parts 120c that cover the top surface of the lower layer 110 between the first metal lines 111a and the second metal lines 111b, and a gap-fill part 120d that fills a space between the first metal lines 111a and defines the air gap AG between the second metal lines 111b. For example, since there may be no boundary between the passivation layer PA and the liner layer 120, the sidewall parts 120a of the passivation layer PA may be merged with the sidewall parts 120a of the liner layer 120 to be a single element (e.g., and referred to hereinafter as sidewall parts 120a of the passivation layer PA), the upper parts 120b of the passivation layer PA may be merged with the upper parts 120b of the liner layer 120 to be a single element (e.g., and referred to hereinafter as upper parts 120b of the passivation layer PA), and the lower parts 120c of the passivation layer PA may be merged with the lower parts 120c of the liner layer 120 to be a single element (e.g., and referred to hereinafter as lower parts 120c of the passivation layer PA).

The sidewall parts 120a of the passivation layer PA may be in contact with the sidewalls of the first and second metal lines 111a and 111b. The lower parts 120c of the passivation layer PA may be in contact with the top surface of the lower layer 110, and the upper parts 120b of the passivation layer PA may be in contact with top surfaces of the first and second metal capping patterns 113a and 113b. Between neighboring first or second metal lines 111a or 111b, the gap-fill part 120d of the passivation layer PA may be provided between the sidewall parts 120a.

The passivation layer PA may have pores, and a density of the pores at the sidewall parts 120a may be greater than that of the pores at the upper parts 120b and that of the pores at the lower parts 120c. For the passivation layer PA, the sidewall parts 120a may be formed of a porous dielectric material, and the upper parts 120b and lower parts 120c may be formed of a non-porous dielectric material. For the passivation layer PA, the sidewall parts 120a may have a dielectric constant less than those of the upper part 120b and lower parts 120c.

The passivation layer PA may be formed by performing a deposition process that uses oxygen and silane, and when the deposition process is performed, oxygen may remain in the passivation layer PA. For example, the passivation layer PA may be a high density plasma (HDP) oxide layer that contains hydrogen. A concentration of hydrogen in the passivation layer PA may be greater than that of hydrogen in the lower layer 110.

When the passivation layer PA is deposited, the passivation layer PA may have a second thickness t2 (e.g., measured along a direction normal to an upper surface of the semiconductor substrate 100) between the first metal lines 111a. Further, the passivation layer PA may have a third thickness t3 (e.g., measured along the direction normal to the upper surface of the semiconductor substrate 100) on the first metal capping patterns 113a in the first region R1, with the third thickness t3 being less than the second thickness t2. On the first region R1, the second thickness t2 and the third thickness t3 may be greater than a first thickness t1 of the liner layer 120, i.e., the thickness of the upper parts 120b of the liner layer 120 along the direction normal to the upper surface of the semiconductor substrate 100 (FIG. 4). For example, referring to FIG. 5, the second and third thicknesses t2 and t3 may include the first thickness t1 of the liner layer 120 (i.e., indicated by the dashed line in FIG. 5). The passivation layer PA may have a thickness that is greater between the first metal lines 111a than between the second metal lines 111b.

When the passivation layer PA is deposited, because a narrow interval (e.g., the second interval S2) is provided between the second metal lines 111b, the air gap AG may be formed between the second metal lines 111b. A portion of the air gap AG may be defined by the sidewall parts 120a of the passivation layer PA or by a porous layer. In addition, the air gap AG may have a summit, e.g., vertex, located at a level higher than those of the top surfaces of the first and second metal lines 111a and 111b, e.g., relative to the upper surface of the semiconductor substrate 100. On the second region R2 where the second metal lines 111b have a narrow interval (e.g., the second interval S2), a porous layer and the air gap AG may be formed between the sidewalls of, e.g., adjacent ones of, the second metal lines 111b, and thus it may be possible to reduce a parasitic capacitance between the second metal lines 111b.

After the formation of the passivation layer PA, a high-temperature annealing process may be performed on the semiconductor substrate 100 (S40). When the annealing process is performed, hydrogen contained in the passivation layer PA may be transmitted to transistors formed on the semiconductor substrate 100. The annealing process may be performed at a temperature of equal to or less than about 450° C., e.g., from about 250° C. to about 450° C.

The first and second metal lines 111a and 111b may expand during the annealing process and may contract after the annealing process. According to some embodiments, the sidewall parts 120a (or porous areas) of the passivation layer PA may reduce stress applied to the first and second metal lines 111a and 111b (i.e., stress that is induced by a difference in thermal expansion coefficient between the passivation layer PA and the first and second metal lines 111a and 111b before and after the annealing process). Therefore, the first and second metal lines 111a and 111b may be prevented from being broken due to the difference in thermal expansion coefficient between the passivation layer PA and the first and second metal lines 111a and 111b.

Referring to FIGS. 6A and 6B, the sidewall part 120a of the passivation layer PA may include pores 120p. The pores 120p may have directionality along an upward or downward diagonal direction. For example, the sidewall part 120a of the passivation layer PA may have a comb pattern in a certain direction, e.g., the pores 120p may be inclined upward from the first metal line 111a to the gap-fill part 120d (FIG. 6A) or may be inclined downward from the first metal line 111a to the gap-fill part 120d (FIG. 6B). In another example, referring to FIG. 6C, the sidewall part 120a of the passivation layer PA may include pores 120p that have directionality in a direction substantially parallel to a top surface of the semiconductor substrate 100.

Referring to FIG. 7, a portion of the air gap AG may be defined by the sidewall parts 120a of the passivation layer PA, where the sidewall parts 120a are formed of a porous layer. Therefore, the air gap AG may be defined by an irregular surface.

Referring to FIG. 8, between the second metal lines 111b, the air gap AG may have lateral surfaces SF1 adjacent to the sidewalls of the second metal lines 111b and may also have a bottom surface SF2 adjacent to the top surface of the lower layer 110. The lateral surfaces SF1 of the air gap AG may be formed of a porous layer, and thus a surface roughness on the lateral surfaces SF1 of the air gap AG may be greater than that on the bottom surface SF2 of the air gap AG.

Figure 9:
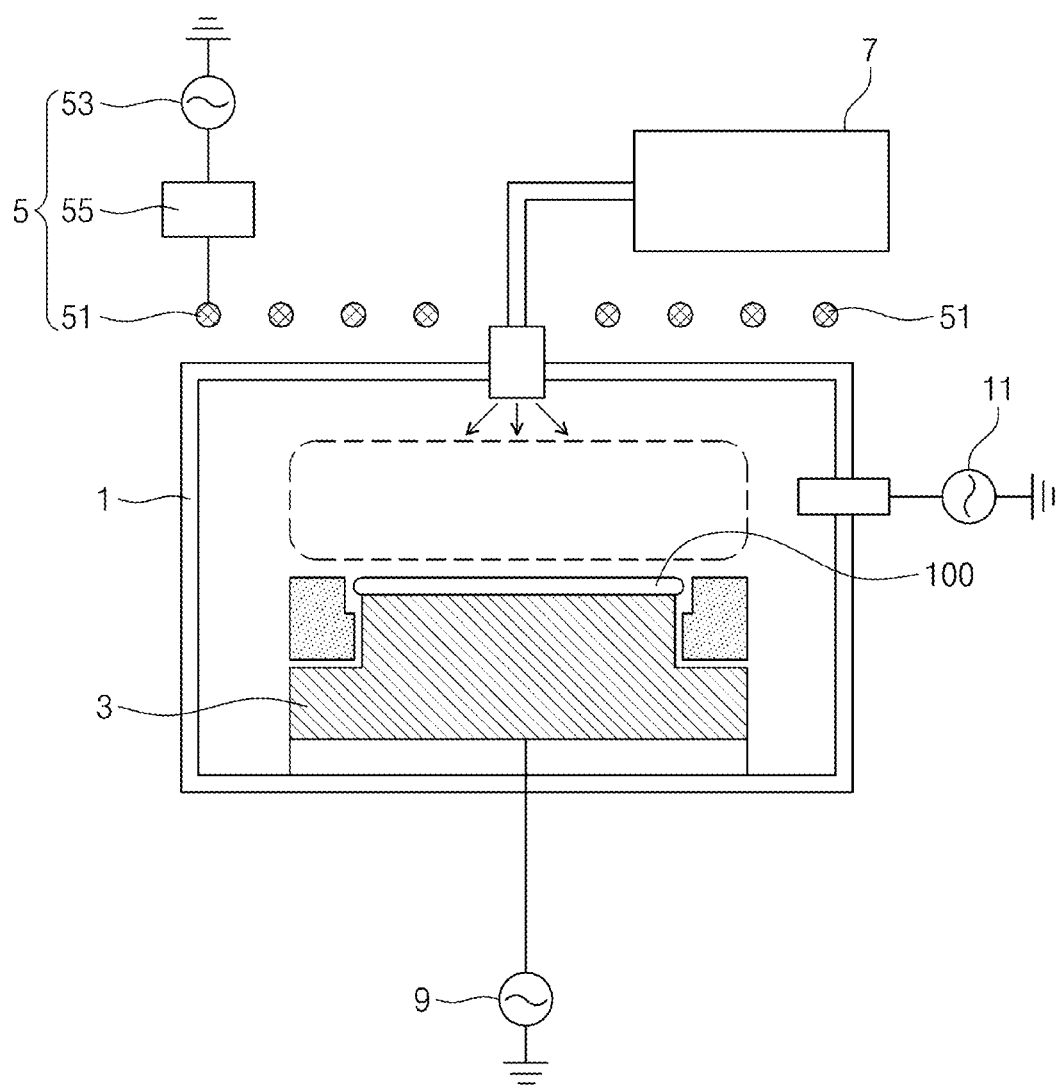
FIG. 9 illustrates a schematic diagram showing a semiconductor fabrication apparatus used for forming a semiconductor device according to some embodiments.
Figure 10:
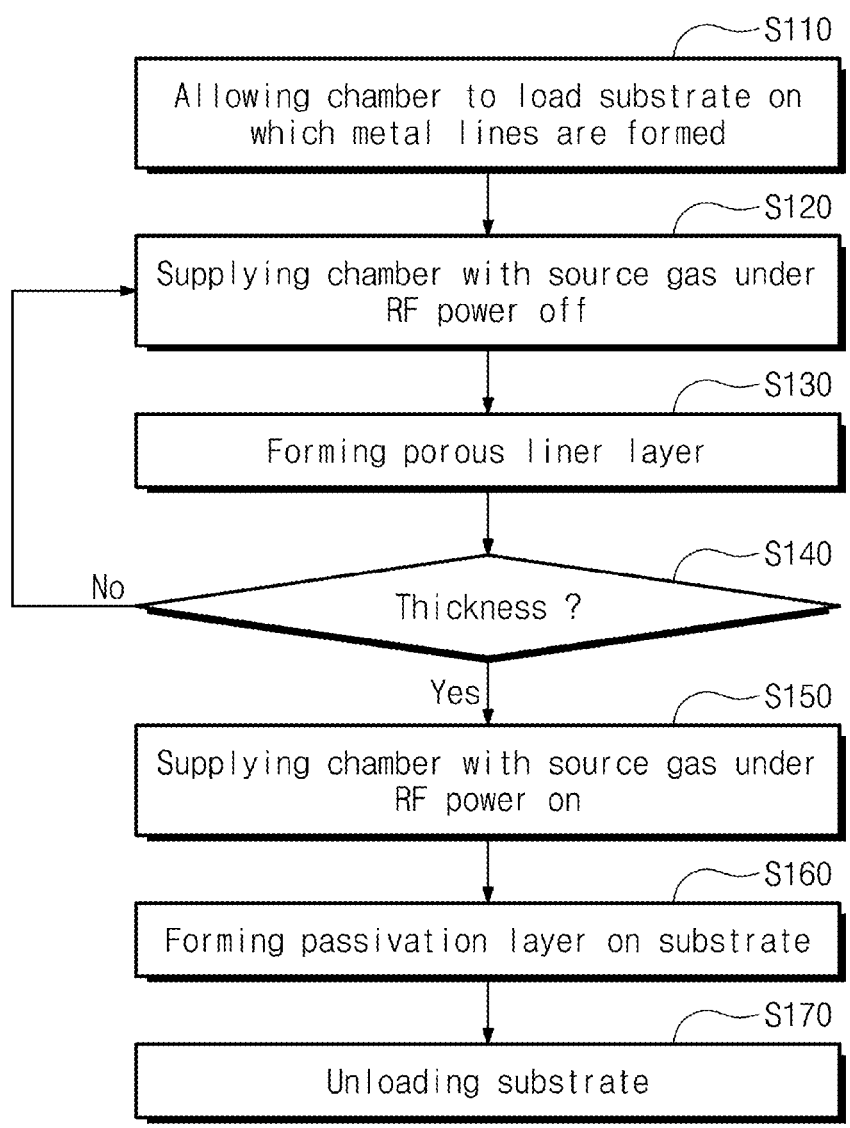
FIG. 10 illustrates a flow chart of a method of forming a liner layer and a passivation layer of a semiconductor device according to some embodiments.

FIG. 9 illustrates a schematic diagram of a semiconductor fabrication apparatus used for forming a semiconductor device according to some embodiments. FIG. 10 illustrates a flow chart showing a method of forming the liner layer 120 and the passivation layer PA according to some embodiments.

Referring to FIG. 9, a semiconductor fabricating apparatus, e.g., facility, may include a process chamber 1 that has an internal space, a chuck 3 inside the process chamber 1, a plasma generation unit 5, a gas supply unit 7, a bias power source 9, and a sidewall power source 11.

The process chamber 1 may include a top plate that closes an upper end of the internal space, a bottom plate that closes a lower end of the internal space, and a sidewall part that encloses the internal space. In some embodiments, the top plate of the process chamber 1 may be formed of a ceramic material.

The chuck 3 may be installed inside the process chamber 1. The semiconductor substrate 100 may be loaded on a top surface of the chuck 3. A certain semiconductor process may be performed on the semiconductor substrate 100 loaded in the process chamber 1. The semiconductor substrate 100 may be, e.g., a semiconductor wafer (e.g., silicon wafer). In some embodiments, the chuck 3 may be an electrostatic chuck. The chuck 3 may be located on the bottom plate of the process chamber 1. A heater may be disposed in the chuck 3, and the heater may heat the chuck 3 and/or the semiconductor substrate 100 loaded on the chuck 3 in semiconductor fabrication processes.

The plasma generation unit 5 (i.e., a plasma generator) may provide the semiconductor substrate 100 with a process gas that is supplied in plasma state to the process chamber 1. The plasma generation unit 5 may include an antenna electrode 51 and a plasma power generator 53 connected to the antenna electrode 51. The antenna electrode 51 may have a closed loop shape or a coil shape. A plasma PLA may be induced with plasma power applied to the antenna electrode 51. The plasma power generator 53 may produce the plasma power and apply the produced plasma power to the antenna electrode 51. For example, the plasma power may be a radio frequency (RF) power.

The plasma generation unit 5 may further include a matching unit 55 connected between the plasma power generator 53 and the antenna electrode 51. The plasma power may be transmitted from the plasma power generator 53 through the matching unit 55 to the antenna electrode 51. The matching unit 55 may increase transfer efficiency of the plasma power. Embodiments are not limited to the plasma generation unit 5 discussed above, and the plasma generation unit 5 may be implemented in other forms suitable for plasma generation.

The gas supply unit 7 (i.e., a gas supplier) may provide a process gas into the process chamber 1. The gas supply unit 7 may include a nozzle or showerhead directed toward an internal space of the process chamber 1, and when RF power is applied to the showerhead, the semiconductor substrate 100 may be provided thereon with a process gas that is supplied in plasma state to the process chamber 1.

The process chamber 1 may be provided on its outer sidewalls with sidewall electrodes coupled to the sidewall power source 11. The chuck 3 may be coupled to the bias power source 9. The bias power source 9 and the sidewall power source 11 may each correspond to a power source that produces a radio frequency (RF) power.

According to some embodiments, a high-density plasma deposition process may be performed in the process chamber 1. The high-density plasma deposition process may include alternately and repeatedly performing a deposition process and an etching process. When the high-density plasma deposition process is performed, a physical or chemical etching gas may be utilized to increase gap-fill characteristics.

With reference to FIGS. 9 and 10, the following will describe in detail the formation of the passivation layer PA in a semiconductor fabrication method according to some embodiments.

Referring to FIGS. 9 and 10, the process chamber 1 may be allowed to load the semiconductor substrate 100 on which metal lines are formed (S110). After the semiconductor substrate 100 (with the metal lines) is loaded, a vacuum pump may be used to evacuate, e.g., remove or withdraw, air from the process chamber 1, in order to bring the process chamber 1 into a vacuum state.

Under a condition that a radio frequency (RF) power source is turned off, process gases may be supplied into the process chamber 1 (S120). In a deposition process, the process gases may include, e.g., a silicon source gas, a chlorine source gas, a fluorine source gas, an inert gas, an oxygen-containing gas, a nitrogen-containing gas, a hydrogen-containing gas, or any combination thereof.

For example, the process gases may include a silicon source gas, a fluorine-containing chemical etching gas, an oxygen gas, and a hydrogen gas. The silicon source gas may be a silicon-based gas, e.g., silane ($SiH_4$) gas or a disilane ($Si_2H_6$) gas, and the fluorine-containing chemical etching gas may be a nitrogen trifluoride ($NF_3$) gas. The process gases may further include a physical etching gas, and the physical etching gas may be an inert gas, e.g., a helium (He) gas or an argon (Ar) gas.

As the process gases are supplied into the process chamber 1 under a condition that RF power is turned off, the liner layer (see 120 of FIG. 4) may be conformally formed on the semiconductor substrate 100 (S130). In this stage, as discussed above with reference to FIG. 4, the liner layer 120 may be deposited on sidewalls and top surfaces of the metal lines 111a and 111b, and on a surface of the lower layer 110 between the metal lines 111a and 111b. The liner layer 120 may have a substantially irregular thickness, e.g., portions of the liner layer 120 may be thicker on the top surfaces of the metal lines 111a and 111b than on sidewalls of the metal lines 111a and 111b due to weaker or lower deposition flow reaching lateral surfaces (sidewalls) at a predetermined interval as compared to the top surfaces. The liner layer 120 may be deposited at a temperature of equal to or less than about 350° C., e.g., from about 200° C. to about 350° C.

The liner layer 120 may be deposited to have a certain thickness, e.g., a predetermined thickness, on the sidewalls of the first and second metal lines 111a and 111b (S140). For example, the liner layer 120 may be deposited to a thickness of equal to or greater than about 50 Å, e.g., from about 50 Å to about 2,000 Å, on the sidewalls of the first and second metal lines 111a and 111b. For example, referring to FIG. 10, the deposition process may continue until the liner layer 120 reaches the certain thickness on the sidewalls of the first and second metal lines 111a and 111b to form the sidewalls parts 120a at the predetermined thickness.

After the liner layer 120 is deposited to the certain, e.g., predetermined, thickness, the process gases may be supplied into the process chamber 1 under the condition of the RF power being turned on (S150). Therefore, plasma may be generated in the process chamber 1. In other words, after the liner layer 120 is deposited to the certain, e.g., predetermined, thickness without RF power, the RF power may be turned on to generate plasma in the process chamber 1.

As the process gases are supplied into the process chamber 1, while the RF power is turned on, the passivation layer PA may be formed on the liner layer 120 (S160). The RF power may cause the passivation layer PA to have a density greater than that of the liner layer 120. For example, referring to FIGS. 5 and 10, as the same process gases are continued to be supplied into the process chamber 1, while the RF power is turned on, the passivation layer PA may be formed on the liner layer 120 to be denser than the liner layer 120. When the passivation layer PA is deposited, as discussed above with reference to FIG. 5, the air gap AG may be formed between the second metal lines 111b whose interval is narrow, e.g., due to the higher density of the passivation layer PA.

As discussed with reference to FIG. 5, after the lower layer 110 is provided thereon with the liner layer 120 and the passivation layer PA that are formed to cover the first and second metal lines 111a and 111b, the semiconductor substrate 100 may be unloaded from the process chamber 1 (S170). For example, referring back to FIG. 5, portions of the liner layer 120 are indicated by a dashed line in FIG. 5, for clarity.

Figure 11:
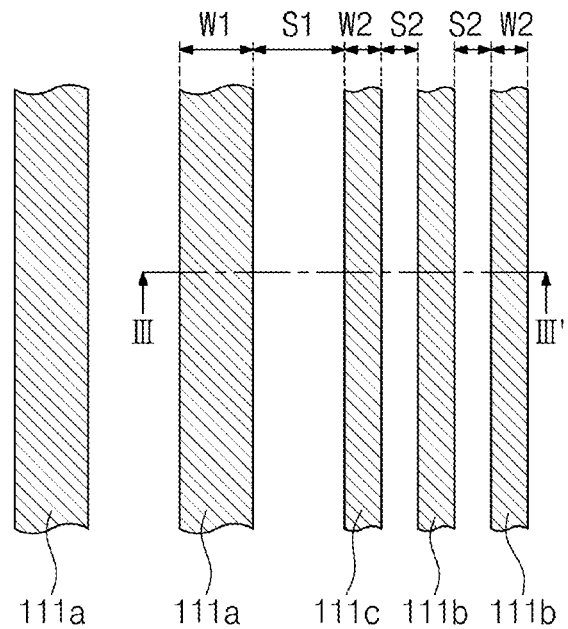
FIG. 11 illustrates a partial plan view of a semiconductor device according to some embodiments.
Figure 12:
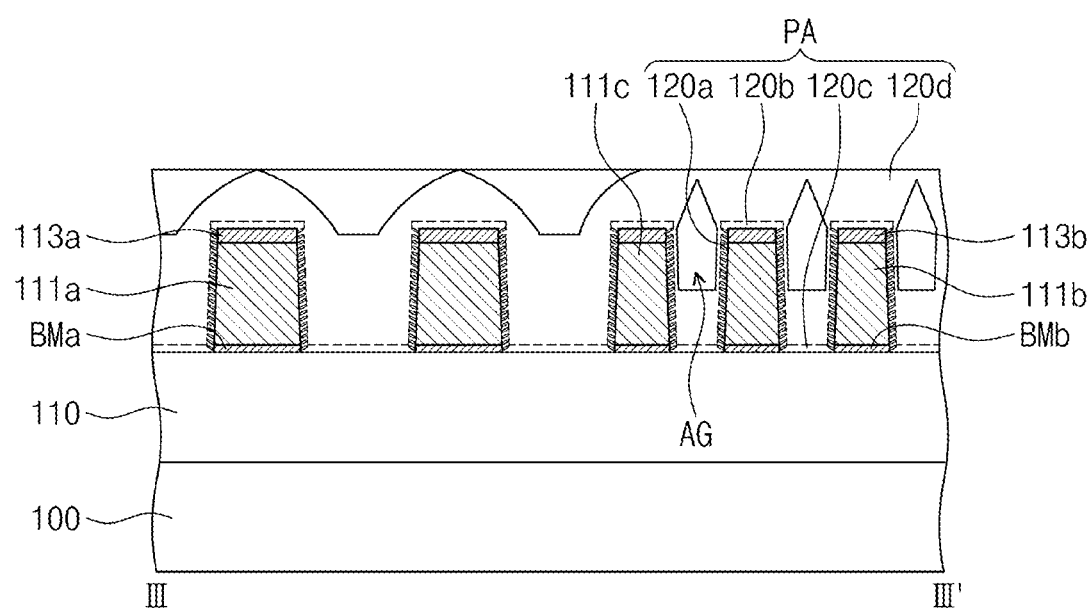
FIG. 12 illustrates a cross-sectional view along line III-III' of FIG. 10, showing a semiconductor device according to some embodiments.

FIG. 11 illustrates a partial plan view of a semiconductor device according to some embodiments. FIG. 12 illustrates a cross-sectional view taken along line III-III' of FIG. 11. Technical features that are the same as those of the semiconductor device discussed above with reference to FIGS. 1-8 may be omitted in the interest of brevity of description.

Referring to FIGS. 11 and 12, the lower layer 110 may be provided thereon with first, second, and third metal lines 111a, 111b, and 111c that extend in parallel along one direction. The first metal lines 111a may have a first width W1, and the second and third metal lines 111b and 111c may have a second width W2 less than the first width W1.

The first metal lines 111a may be spaced apart from each other at a first interval S1, and the second metal lines 111b may be spaced apart from each other at a second interval S2 less than the first interval S1. The third metal line 111c may be disposed between the first metal line 111a and the second metal line 111b. The third metal line 111c may be spaced apart at the first interval S1 from the first metal line 111a adjacent thereto and at the second interval S2 from the second metal line 111b adjacent thereto. Barrier metal patterns BMa, BMb, and BMc may be disposed on bottom surfaces of the first, second, and third metal lines 111a, 111b, and 111c, respectively, and metal capping patterns 113a, 113b, and 113c may be disposed on top surfaces of the first, second, and third metal lines 111a, 111b, and 111c, respectively.

The lower layer 110 may be provided thereon with the passivation layer PA that covers the first, second, and third metal lines 111a, 111b, and 111c. The passivation layer PA may include sidewall parts 120a that cover the sidewalls of the first, second, and third metal lines 111a, 111b, and 111c, upper parts 120b that cover the top surfaces of the first, second, and third metal lines 111a, 111b, and 111c, lower parts 120c that cover the top surface of the lower layer 110, and a gap-fill part 120d that fills a space between the first metal lines 111a and defines the air gap AG between the second metal lines 111b and between the second and third metal lines 111b and 111c. As discussed above, the passivation layer PA may have pores, and a density of the pores at the sidewall parts 120a may be greater than that of pores at the upper parts 120b and that of pores at the lower parts 120c.

According to the present embodiment, a porous layer on the sidewalls of the first and third metal lines 111a and 111c that are adjacent to each other may serve as a stress buffer. Therefore, a tensile or compressive stress applied to the third metal line 111c may decrease to reduce breakage failure of the third metal line 111c.

Figure 13:
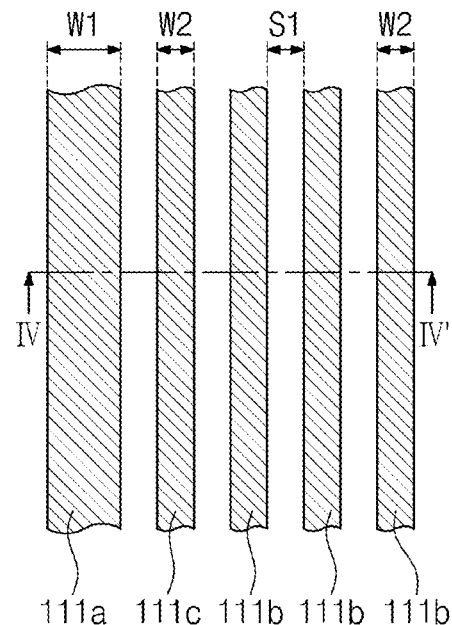
FIG. 13 illustrates a partial plan view of a semiconductor device according to some embodiments.
Figure 14:
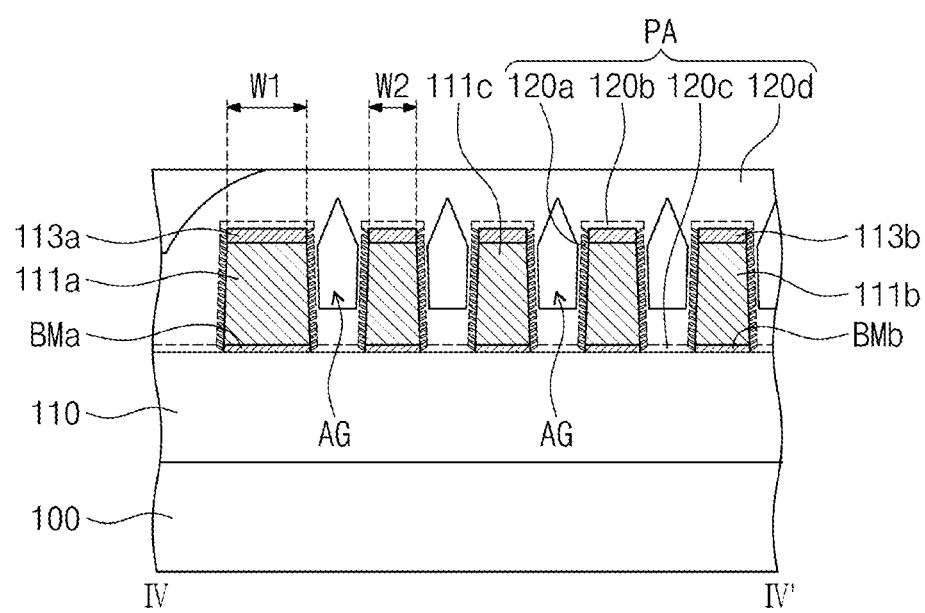
FIG. 14 illustrates a cross-sectional view along line IV-IV' of FIG. 10, showing a semiconductor device according to some embodiments.

FIG. 13 illustrates a partial plan view of a semiconductor device according to some embodiments. FIG. 14 illustrates a cross-sectional view along line IV-IV' of FIG. 13. Technical features that are the same as those of the semiconductor device discussed above with reference to FIGS. 1-8 may be omitted in the interest of brevity of description.

Referring to FIGS. 13 and 14, the lower layer 110 may be provided thereon with first, second, and third metal lines 111a, 111b, and 111c that extend in parallel along one direction. The first metal lines 111a may have a first width W1, and the second and third metal lines 111b and 111c may have a second width W2 less than the first width W1. The first, second, and third metal lines 111a, 111b, and 111c may be spaced apart from each other at the same first interval S1. The third metal line 111c may be disposed between the first metal line 111a and the second metal line 111b.

The lower layer 110 may be provided thereon with the passivation layer PA that covers the first, second, and third metal lines 111a, 111b, and 111c, and the air gap AG may be present between the first and third metal lines 111a and 111c, between the second and third metal lines 111b and 111c, and between the second metal lines 111b. The passivation layer PA may include sidewall parts 120a that cover the sidewalls of the first, second, and third metal lines 111a, 111b, and 111c, upper parts 120b that cover the top surfaces of the first, second, and third metal lines 111a, 111b, and 111c, lower parts 120c that cover the top surface of the lower layer 110, and a gap-fill part 120d that defines the air gap AG between the first and third metal lines 111a and 111c, between the second and third metal lines 111b and 111c, and the between the second metal lines 111b. Even if the first metal line 111a is disposed adjacent to the third metal line 111c whose width is different from that of the first metal line 111a, a porous layer and the air gap AG are provided between the first and third metal lines 111a and 111c, with the result that it may be possible to reduce a parasitic capacitance between neighboring metal lines.

Figure 15:
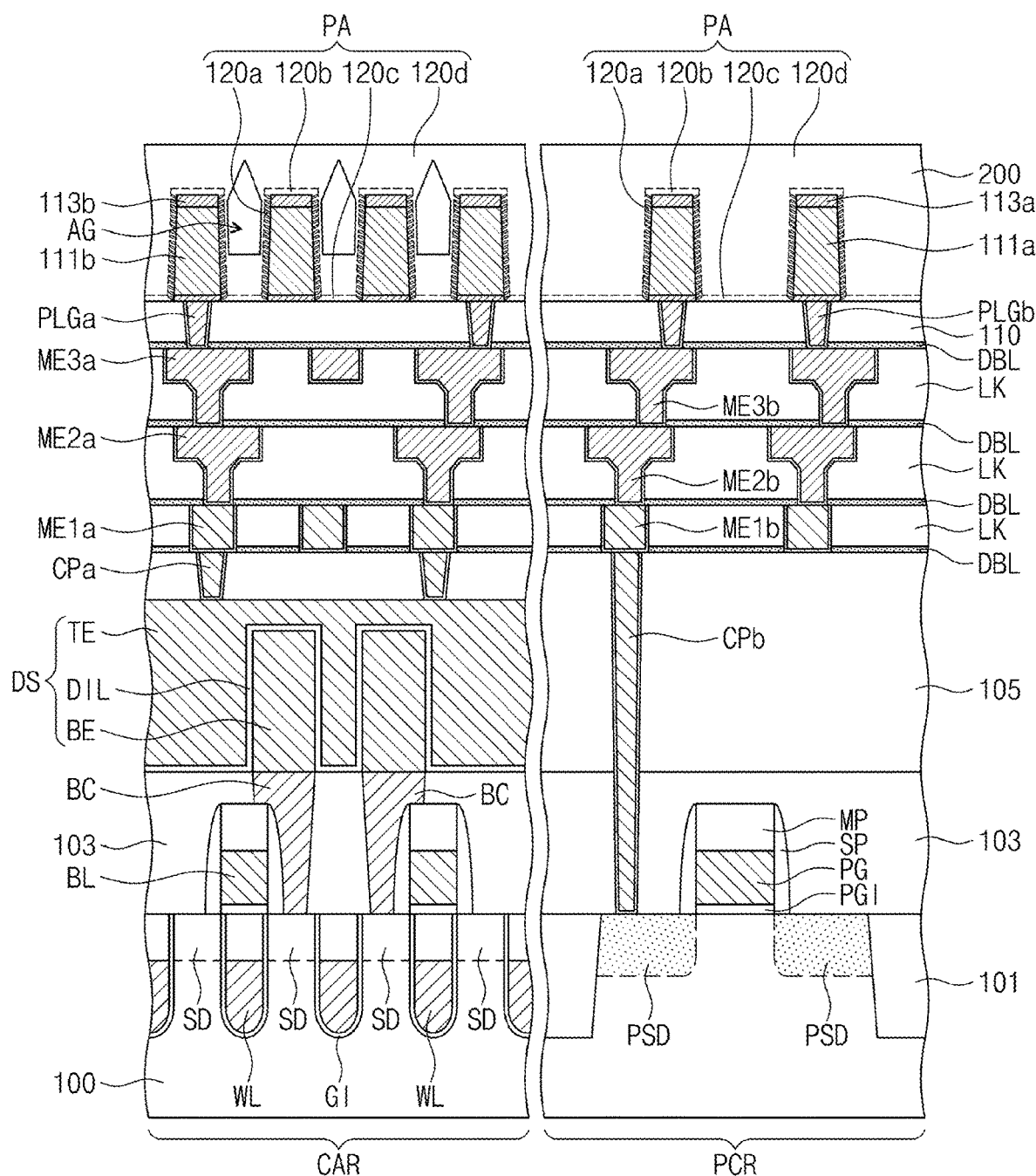
FIG. 15 illustrates a cross-sectional view of a semiconductor device according to some embodiments.

FIG. 15 illustrates a cross-sectional view of a semiconductor device according to some embodiments.

Referring to FIG. 15, the semiconductor substrate 100 may include a cell array region CAR and a peripheral circuit region PCR around the cell array region CAR.

According to some embodiments, on the cell array region CAR, the semiconductor substrate 100 may be provided thereon with a memory cell array that includes a plurality of memory cells. The cell array region CAR may include a plurality of memory cells, a plurality of word lines WL electrically connected to the memory cells, and a plurality of bit lines BL electrically connected to the memory cells. According to some embodiments, each of the memory cells may include a selection transistor and a data storage element DS. On the peripheral circuit region PCR, the semiconductor substrate 100 may be provided thereon with a peripheral circuit that includes row and column decoders, a sense amplifier, and a control logic.

For example, a device isolation layer 101 defining cell active sections may be formed in the semiconductor substrate 100 on the cell array region CAR. The cell active sections may have a bar shape, and a major axis of the cell active sections may be disposed in a diagonal direction with respect to the word lines WL and the bit lines BL.

The word lines WL may be disposed to run across the cell active sections. In some embodiments, the word lines WL may be formed in recess regions that are recessed to a certain depth from a surface of the semiconductor substrate 100, and a gate dielectric layer GI may be disposed below each of the word lines WL. The word lines WL may have their top surfaces located at a lower level than that of a top surface of the semiconductor substrate 100, and a dielectric material may fill the recess region in which the word line WL is formed.

Cell source and drain regions SD may be formed in the cell active section on opposite sides of each of the word lines WL. The cell source and drain regions SD may be impurity regions doped with n-type or p-type impurities. As discussed above, as the word lines WL and the cell source and drain regions SD are formed, a plurality of metal oxide semiconductor (MOS) transistors may be formed on the semiconductor substrate 100.

On the cell array region CAR, the semiconductor substrate 100 may be provided thereon with the bit lines BL that are disposed running across the word lines WL. An interlayer dielectric layer may be interposed between the bit lines BL and the semiconductor substrate 100, and bit-line contact plugs may penetrate the interlayer dielectric layer and contact the cell source and drain regions SD.

On the peripheral circuit region PCR, the semiconductor substrate 100 may be provided thereon with a device isolation layer 101 that defines peripheral active sections. A peripheral circuit transistor may be provided on the peripheral active section. The peripheral circuit transistor may include a peripheral gate electrode PG, a peripheral gate dielectric layer PGI, gate spacers SP, and peripheral impurity regions PSD.

The peripheral gate electrode PG may be formed on the semiconductor substrate 100. The peripheral gate electrode PG may run across the peripheral active section and may be formed of the same conductive material as that of the bit lines BL.

The peripheral gate dielectric layer PGI may be disposed between the peripheral gate electrode PG and the semiconductor substrate 100, and may be formed of the same dielectric material as that of the gate dielectric layer GI. The peripheral gate electrode PG may be provided thereon with a gate hardmask pattern MP formed of a dielectric material.

Gate spacers SP may be disposed on opposite sidewalls of the peripheral gate electrode PG. The peripheral impurity regions PSD may be disposed in the peripheral active section on opposite sides of the peripheral gate electrode PG. The peripheral impurity regions PSD may be doped with impurities whose conductivity type is different from that of impurities of the peripheral active section.

A first interlayer dielectric layer 103 may be disposed on an entire surface of the semiconductor substrate 100. For example, the first interlayer dielectric layer 103 may include borophosphosilicate glass (BPSG), Tonen Silazene (TOSZ), undoped silicate glass (USG), spin-on glass (SOG), flowable oxide (FOX), tetraethylorthosilicate (TEOS), high density plasma chemical vapor deposition (HDP CVD) oxide, or hydrogen silsesquioxane (HSQ).

On the cell array region CAR, buried contact plugs BC may penetrate the first interlayer dielectric layer 103 and contact the cell source and drain regions SD. A data storage element DS may be disposed on each of the buried contact plugs BC. For example, the data storage element DS may include a capacitor including a bottom electrode BE, a top electrode TE, and a dielectric layer DIL between the bottom and top electrodes BE and TE, and the bottom electrode BE may be connected to the buried contact plug BC.

In some embodiments, the data storage element DS may include a variable resistance material that can be switched from one to the other of its two resistance states by an applied electrical pulse. For example, the data storage element DS may include at least one magnetic material or a phase change material whose crystal state is changed based on an amount of current. For another example, the data storage element DS may include Perovskite compound or transition metal oxide.

The first interlayer dielectric layer 103 may be provided thereon with a second interlayer dielectric layer 105 disposed on the entire surface of the semiconductor substrate 100. A cell contact plug CPa may penetrate the second interlayer dielectric layer 105 and contact the top electrode TE, and a peripheral contact plug CPb may penetrate the first and second interlayer dielectric layers 103 and 105 and contact the peripheral circuit transistor. The cell and peripheral contact plugs CPa and CPb may include at least one of, e.g., tungsten (W), titanium (Ti), tantalum (Ta), and nitride thereof.

A plurality of lower dielectric layers LK may be stacked on the cell array region CAR and on the second interlayer dielectric layer 105 of the peripheral circuit region PCR. Cell lower lines ME1a, ME2a, and ME3a may be formed in the lower dielectric layers LK on the cell array region CAR, and peripheral lower lines ME1b, ME2b, and ME3b may be formed in the lower dielectric layers LK on the peripheral circuit region PCR. The lower dielectric layers LK may be formed of a low-k dielectric material whose dielectric constant is less than that of a silicon oxide layer. For example, the lower dielectric layers LK may include fluorine-doped oxide (or FSG), carbon-doped oxide, silicon oxide, hydrogen silsesquioxane (HSG, SiO:H), methyl silsesquioxane (MSQ, SiO:CH$_3$), or a-SiOC (SiOC:H).

Barrier layers DBL may be interposed between the lower dielectric layers LK, and an uppermost barrier layer DBL may cover top surfaces of uppermost cell and peripheral lower lines ME3a and ME3b and a top surface of an uppermost lower dielectric layer LK. The barrier layers DBL may include, e.g., silicon nitride (SiN), silicon oxynitride (SiON), silicon carbide (SiC), silicon carbon nitride (SiCN), or a combination thereof.

The cell lower lines ME1a, ME2a, and ME3a may be electrically connected to the cell contact plugs CPa and the data storage elements DS. For example, the cell lower lines ME1a, ME2a, and ME3a may be electrically connected to selection transistors. For example, first, second, and third cell lower lines ME1a, ME2a, and ME3a may be stacked, and the first cell lower line ME1a at lowermost position may be in direct contact with the cell contact plug CPa. The second and third cell lower lines ME2a and ME3a may each include a via part and a line part.

The peripheral lower lines ME1b, ME2b, and ME3b may be electrically connected through the peripheral contact plugs CPb to the peripheral transistor. The peripheral lower lines ME1b, ME2b, and ME3b may be formed simultaneously with the cell lower lines ME1a, ME2a, and ME3a of the cell array region CAR. For example, first, second, and third peripheral lower lines ME1b, ME2b, and ME3b may be vertically stacked, and the first peripheral lower line ME1b at lowermost position may be in direct contact with the peripheral contact plug CPb. The second and third peripheral lower lines ME2b and ME3b may each include a via part and a line part. The third peripheral lower lines ME3b may be electrically connected through via parts to the second peripheral lower lines ME2b. The cell lower lines ME1a, ME2a, and ME3a and the peripheral lower lines ME1b, ME2b, and ME3b may include, e.g., copper or a copper alloy. In this description, the copper alloy may indicate copper mixed with an extremely small amount of one of, e.g., C, Ag, Co, Ta, In, Sn, Zn, Mn, Ti, Mg, Cr, Ge, Sr, Pt, Mg, Al, and Zr.

The lower layer 110 may be provided on the uppermost barrier layer DBL, and the lower layer 110 may be provided therein with cell contact plugs PLGa and peripheral contact plugs PLGb. The cell contact plugs PLGa and the peripheral contact plugs PLGb may penetrate the lower layer 110 and connect with the cell and peripheral lower lines ME3a and ME3b. The lower layer 110 may be provided thereon with the first and second metal lines 111a and 111b and the passivation layer PA, as discussed with reference to FIGS. 1 to 5.

According to some embodiments, second metal lines 111b may be provided on the lower layer 110 of the cell array region CAR, and first metal lines 111a may be provided on the lower layer 110 of the peripheral circuit region PCR. As discussed above with reference to FIGS. 2 to 5, an interval between the first metal lines 111a may be greater than that of the second metal lines 111b. In some embodiments, no limitation is imposed on an area where the first and second metal lines 111a and 111b are provided, and alternatively, the first metal lines 111a may be provided on the cell array region CAR and the second metal lines 111b may be provided on the peripheral circuit region PCR. In some embodiments, the first and second metal lines 111a and 111b may be simultaneously provided on either the cell array region CAR or the peripheral circuit region PCR.

As discussed above with reference to FIG. 5, the passivation layer PA may include sidewall parts 120a that are formed of a porous layer on sidewalls of the first and second metal lines 111a and 111b. In addition, the passivation layer PA may be formed of a hydrogen-containing oxide layer and may provide hydrogen to cell and peripheral transistors in semiconductor fabrication processes. The hydrogen may improve electrical properties by combining with dangling bonds or crystal defects of silicon in the cell and peripheral transistors.

According to some embodiments, a porous layer may be selectively formed on sidewalls of metal lines when forming a passivation layer that covers the metal lines, and thus the porous layer may serve as a stress buffer in a high-temperature annealing process. Accordingly, the metal lines may be prevented from being broken due to difference in thermal expansion coefficient between the passivation layer and the metal lines. Simultaneously, a porous layer and an air gap may be formed between the metal lines on narrow regions, and thus a parasitic capacitance may be reduced between the metal lines.

In addition, the passivation layer may be deposited at lower temperatures, and therefore, the passivation layer may have therein an increased amount of hydrogen. Accordingly, transistors may be provided with hydrogen to improve electrical properties of semiconductor devices.

By way of summation and review, highly integrated semiconductor device with reduced critical dimension (CD) have been developed. However, high speed operation is difficult to achieve because reduction in CD increases resistance of metal lines and capacitance between metal lines. Therefore, embodiments provide a semiconductor device with improved electrical properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a semiconductor substrate including a first region and a second region;
first metal lines spaced apart from each other at a first interval on the first region;
second metal lines spaced apart from each other at a second interval on the second region, the second interval being smaller than the first interval; and
a passivation layer on the semiconductor substrate and covering the first and second metal lines, the passivation layer including:
sidewall parts that cover sidewalls of the first metal lines and the second metal lines, the sidewall parts including a porous dielectric material,
upper parts that cover top surfaces of the first metal lines and the second metal lines, and
an air gap defined by the sidewall parts between the second metal lines,
wherein a density of pores in the sidewall parts is greater than a density of pores in the upper parts.

2. The semiconductor device as claimed in claim 1, wherein the upper parts include a non-porous dielectric material.

3. The semiconductor device as claimed in claim 1, wherein the sidewall parts of the passivation layer include pores that have directionality in a certain direction.

4. The semiconductor device as claimed in claim 1, further comprising a lower layer between the semiconductor substrate and the first and second metal lines,
wherein the passivation layer further includes a lower part between adjacent ones of the first metal lines and between adjacent ones of the second metal lines, the lower part covering a top surface of the lower layer, and
wherein a density of pores in the lower part of the passivation layer is less than a density of pores in the sidewall parts of the passivation layer.

5. The semiconductor device as claimed in claim 1, wherein a vertex of the air gap is at a level higher than levels of the top surfaces of the first metal lines and the second metal lines.

6. The semiconductor device as claimed in claim 1, further comprising a lower layer between the semiconductor substrate and the first and second metal lines,
wherein the air gap has lateral surfaces adjacent to the sidewalls of the second metal lines and a bottom surface adjacent to a top surface of the lower layer, and
wherein a surface roughness on the lateral surfaces is greater than a surface roughness on the bottom surface.

7. The semiconductor device as claimed in claim 1, wherein the passivation layer has a first thickness between the first metal lines and a second thickness on the first metal lines, the second thickness being less than the first thickness.

8. The semiconductor device as claimed in claim 1, further comprising a metal capping pattern between the passivation layer and the top surface of each of the first metal lines and the second metal lines, the upper parts of the passivation layer being in contact with the metal capping pattern.

9. The semiconductor device as claimed in claim 1, wherein the passivation layer includes an oxide layer containing hydrogen.

10. The semiconductor device as claimed in claim 1, wherein a thickness of the passivation layer between the first metal lines is greater than a thickness of the passivation layer between the second metal lines.

11. A semiconductor device, comprising:
metal lines on a semiconductor substrate; and
a passivation layer that covers the metal lines, the passivation layer including:
sidewall parts that cover sidewalls of the metal lines, and
upper parts that cover top surfaces of the metal lines, wherein a density of pores in the sidewall parts is greater than a density of pores in the upper parts.

12. The semiconductor device as claimed in claim 11, wherein the passivation layer has an air gap between the metal lines, the air gap being defined by the sidewall parts.

13. The semiconductor device as claimed in claim 11, wherein the sidewall parts have a thickness of about 50 Å to about 2,000 Å on the sidewalls of the metal lines.

14. The semiconductor device as claimed in claim 11, wherein the passivation layer includes an oxide layer containing hydrogen.

15. The semiconductor device as claimed in claim 11, wherein the passivation layer further includes a gap-fill part that fills a space between the metal lines, a density of pores in the gap-fill part is less than the density of pores in the sidewall parts.

16. A semiconductor device, comprising:
a first metal line that has a first width on a lower layer;
a second metal line that has a second width less than the first width on the lower layer;
a third metal line that has the second width on the lower layer, the third metal line being between the first metal line and the second metal line; and
a passivation layer that covers the first metal line, the second metal line, and the third metal line, the passivation layer including:
a porous region adjacent to sidewalls of each of the first metal line, the second metal line, and the third metal line, and
a non-porous region adjacent to a top surface of each of the first metal line, the second metal line, and the third metal line.

17. The semiconductor device as claimed in claim 16, wherein the passivation layer has an air gap between the second and third metal lines.

18. The semiconductor device as claimed in claim 17, wherein the air gap has lateral surfaces adjacent to the sidewalls of the second metal line and the third metal line, and a bottom surface adjacent to a top surface of the lower layer, a surface roughness on the lateral surfaces is greater than a surface roughness on the bottom surface.

19. The semiconductor device as claimed in claim 17, wherein a vertex of the air gap is at a level higher than levels of the top surfaces of the first metal line, the second metal line, and the third metal line.

* * * * *